United States Patent
Lee et al.

(10) Patent No.: US 6,765,645 B1
(45) Date of Patent: Jul. 20, 2004

(54) DE-PELLICLE TOOL

(75) Inventors: Kuang-Yang Lee, Kaohsiung (TW); Chi-Chang Chang, Nantou (TW); Ming-Tao Ho, Hsinchu (TW); Bill Chiu, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/345,633

(22) Filed: Jan. 15, 2003

(51) Int. Cl.⁷ .............................................. G03B 27/52
(52) U.S. Cl. ...................................................... 355/30
(58) Field of Search ............................. 355/30, 53, 77, 355/75

(56) References Cited

U.S. PATENT DOCUMENTS 4,898,058 A * 2/1990 Seifert .......................... 83/870
5,772,842 A * 6/1998 Tanaka et al. ............... 156/584
5,953,107 A * 9/1999 Li et al. ........................ 355/77

\* cited by examiner

Primary Examiner—Russell Adams
Assistant Examiner—D. Ben Esplin
(74) Attorney, Agent, or Firm—Tung & Associates

(57) ABSTRACT

A de-pellicle tool for removing a pellicle from a reticle during the formation of circuit patterns on substrates in the fabrication of integrated circuits. The de-pellicle tool of the present invention comprises a support frame on which is mounted the reticle and the pellicle supported on the reticle. A pair of handle-actuated lift pins on opposite sides of the support frame are extended into respective pin openings in the pellicle frame, after which the handles are pushed downwardly to raise the lift pins and lift the pellicle frame from the reticle. Accordingly, no moving parts contact the reticle during the pellicle-removing procedure, preventing scratching or other damage to the reticle.

20 Claims, 4 Drawing Sheets

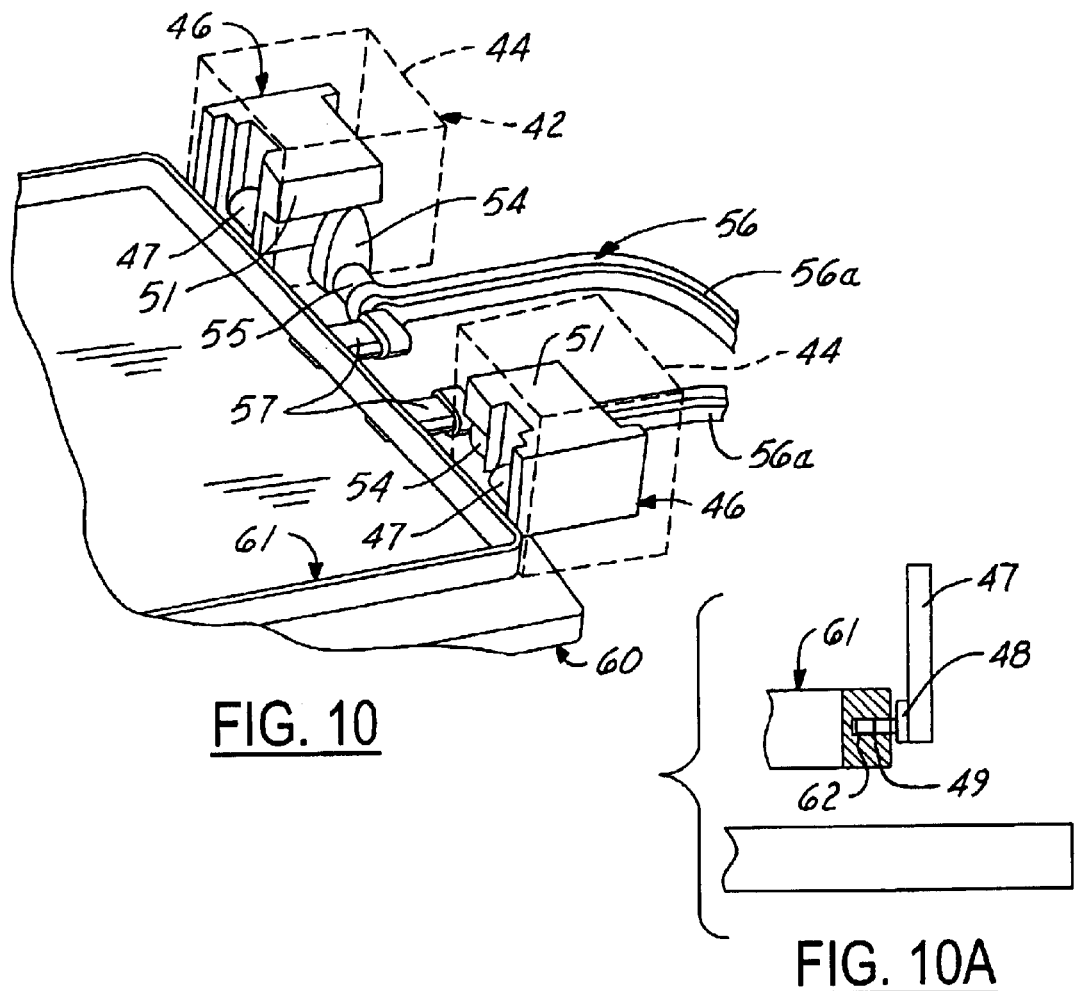
FIG. 10
FIG. 10A
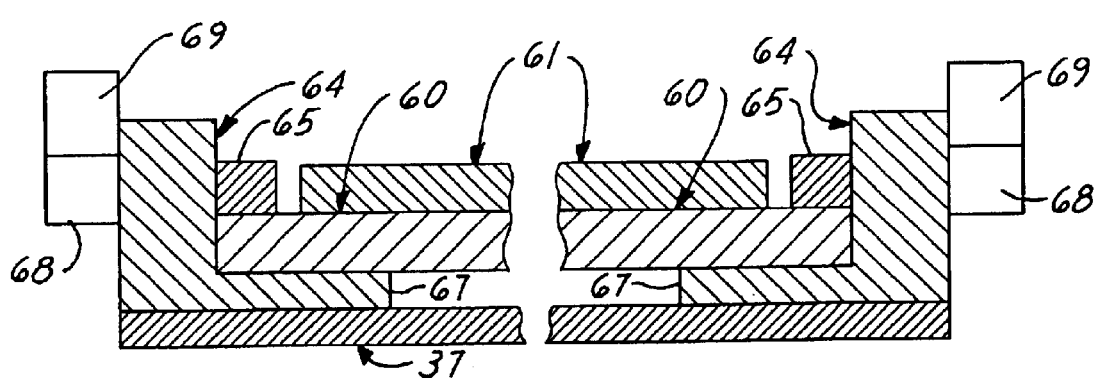
FIG. 11
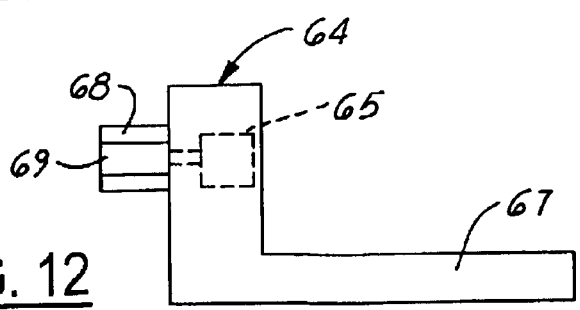
FIG. 12

DE-PELLICLE TOOL

FIELD OF THE INVENTION

The present invention relates to tools for removing a pellicle from a reticle or mask on a semiconductor wafer substrate in the fabrication of semiconductor integrated circuits. More particularly, the present invention relates to a new and improved de-pellicle tool which is capable of removing a pellicle from a mask without touching the mask.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

Photoresist materials are coated onto the surface of a wafer by dispensing a photoresist fluid typically on the center of the wafer as the wafer rotates at high speeds within a stationary bowl or coater cup. The coater cup catches excess fluids and particles ejected from the rotating wafer during application of the photoresist. The photoresist fluid dispensed onto the center of the wafer is spread outwardly toward the edges of the wafer by surface tension generated by the centrifugal force of the rotating wafer. This facilitates uniform application of the liquid photoresist on the entire surface of the wafer.

Spin coating of photoresist on wafers is carried out in an automated track system using wafer handling equipment which transport the wafers between the various photolithography operation stations, such as vapor prime resist spin coat, develop, baking and chilling stations. Robotic handling of the wafers minimizes particle generation and wafer damage. Automated wafer tracks enable various processing operations to be carried out simultaneously. Two types of automated track systems widely used in the industry are the TEL (Tokyo Electron Limited) track and the SVG (Silicon Valley Group) track.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

During the photolithography step of semiconductor production, light energy is applied through a reticle mask onto the photoresist material previously deposited on the wafer to define circuit patterns which will be etched in a subsequent processing step to define the circuits on the wafer. Because these circuit patterns on the photoresist represent a two-dimensional configuration of the circuit to be fabricated on the wafer, minimization of particle generation and uniform application of the photoresist material to the wafer are very important. By minimizing or eliminating particle generation during photoresist application, the resolution of the circuit patterns, as well as circuit pattern density, is increased.

Reticles must remain meticulously clean for the creation of perfect images during its many exposures to pattern a circuit pattern on a substrate. The reticle may be easily damaged such as by dropping of the reticle, the formation of scratches on the reticle surface, electrostatic discharge (ESD), and particles. ESD can cause discharge of a small current through the chromium lines on the surface of the reticle, melting a circuit line and destroying the circuit pattern.

FIG. 1 illustrates a cross-section of a reticle 10, having a mask material layer 12 and a chrome pattern 14 provided in the form of the desired circuit configuration on the mask material 12. During a lithography process, an optically-transparent pellicle film 16, which may be covered on both surfaces with antireflective coatings 18, is typically positioned about 5–10 mm above the reticle 10 to prevent airborne particles 20 from falling on the reticle 10 and thus, damaging the reticle 10 and causing an imaging defect.

As shown in FIG. 2, the pellicle film 16 is tightly stretched on a sealed frame 17 which is supported on the surface of the reticle 10. After the exposure, the pellicle frame 17 is removed from the underlying reticle 10 typically by operation of a conventional, manual de-pellicle tool 24. The conventional de-pellicle tool 24 includes an elongated handle 25 on the end of which is provided a head 26 mounted on rollers 27. A lift pin 28 extends forwardly from the head 26. Accordingly, as shown in FIGS. 2–2B, the pellicle frame 17 is initially raised from the surface of the reticle 10 by resting the rollers 27 on the peripheral surface portion of the reticle 10 and inserting the lift pin 28 into a pin opening 22 extending into the pellicle frame 17. Next, as shown in FIG. 2B, the rollers 27 act as a fulcrum as the handle 25 is lowered to raise the pin lift pin 28 in the pin opening 22 and partially lift the frame 17 from the reticle 10. Finally, the pellicle frame 17 is typically manually grasped and completely removed from the reticle 10.

One of the problems associated with use of the conventional, hand-operated de-pellicle tool 24 to remove the pellicle frame 17 from the reticle 10 is that the rollers 27 frequently scratch the surface of the reticle 10 as the tool 24 is moved forwardly to insert the lift pin 28 into the pin opening 22. Accordingly, a device is needed for raising a pellicle from a reticle without scratching and otherwise damaging the reticle.

An object of the present invention is to provide a new and improved de-pellicle tool for removing a pellicle film from a reticle.

Another object of the present invention is to provide a new and improved de-pellicle tool which prevents scratching or other damage to a reticle during the removal of a pellicle film from the reticle.

Still another object of the present invention is to provide a de-pellicle tool which requires minimal contact of the tool with a reticle for the removal of a pellicle frame and pellicle film from the reticle.

Yet another object of the present invention is to provide a new and improved de-pellicle tool which utilizes multiple lift pins to simultaneously lift a pellicle frame completely from the surface of a reticle.

A still further object of the present invention is to provide a de-pellicle tool which facilitates ease in removing a pellicle frame from a reticle.

Yet another object of the present invention is to provide a de-pellicle tool which facilitates quick, easy, low-risk and efficient removal of a pellicle frame from a reticle.

SUMMARY OF THE INVENTION

In accordance with these and other objects and advantages, the present invention is generally directed to a de-pellicle tool for removing a pellicle from a reticle during the formation of circuit patterns on substrates in the fabrication of integrated circuits. The de-pellicle tool of the present invention comprises a support frame on which is mounted the reticle and the pellicle supported on the reticle. A pair of handle-actuated lift pins on opposite sides of the support frame are extended into respective pin openings in the pellicle frame, after which the handles are pushed downwardly to raise the lift pins and lift the pellicle frame from the reticle. Accordingly, no moving parts contact the reticle during the pellicle-removing procedure, preventing scratching or other damage to the reticle.

BRIEF DESCRIPTION OF THE DRAWINGS

The invention will now be described, by way of example, with reference to the accompanying drawings, in which:

FIG. 10 is a perspective view, partially in section, of a pair of lift blocks connected by a handle on one side of the de-pellicle tool, with the lift blocks shown in the upper, lifting position;

FIG. 10A is a sectional view of the pellicle frame raised from the reticle, with the lift pin inserted in the pin opening provided in the pellicle frame;

FIG. 11 is a cross-sectional view taken along section lines 11—11 in FIG. 8; and FIG. 12 is a side view of a reticle clamp element for supporting a reticle above the pellicle frame element of the de-pellicle tool of the present invention.

DESCRIPTION OF THE PREFERRED EMBODIMENTS

The present invention has particularly beneficial utility in removing a pellicle from a reticle in the fabrication of semiconductor integrated circuits on wafer substrates. However, the invention is not so limited in application, and while references may be made to such pellicles and reticles used in the fabrication of integrated circuits, the invention may be applicable to raising objects in a variety of industrial and mechanical applications.

Figure 3:
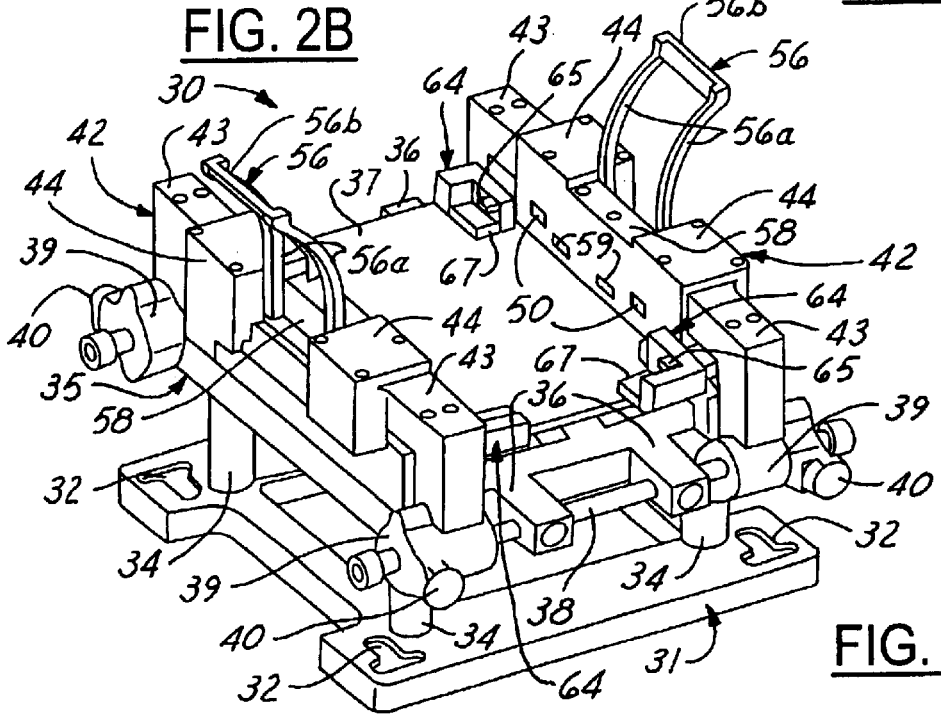
FIG. 3 is a perspective view of an illustrative embodiment of the de-pellicle tool of the present invention.

Referring initially to FIGS. 3–7, an illustrative embodiment of the de-pellicle tool of the present invention is generally indicated by reference numeral 30 and typically includes a base 31 which may be provided with multiple base mount openings 32 to facilitate mounting the base 31 to a surface (not shown), as desired. A support frame 35 is supported on the base 31 by multiple supports 34 extending upwardly from the base 31. A pair of parallel support frame arms 36 extends from each end of the support frame 35. A platform 37 may be provided on the support frame 35, as shown in FIG. 3. Each of a pair of slide shafts 38, the purpose of which will be hereinafter described, extends through aligned shaft openings (not shown) provided in the corresponding pair of support frame arms 36 on each end of the support frame 35.

A pellicle lift unit 42 is provided on the support frame 35 on each side of the platform 37. Each pellicle lift unit 42 includes a support arm 43 which is mounted on each of a pair of shaft collars 39 which slidably engage the respective slide shafts 38. A slide knob 40 may provided on each shaft collar 39 for operably engaging each slide shaft 38, such as through a rack-and-pinion arrangement (not shown) or other mechanism known by those skilled in the art, to facilitate advancing each pellicle lift unit 42 on the slide shafts 38 toward or away from the support frame 35, as shown in FIG. 7.

Figure 1:
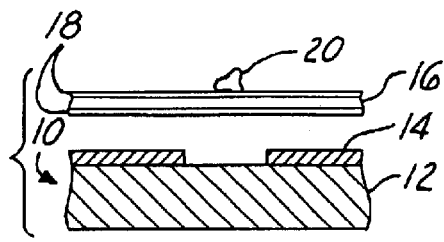
FIG. 1 is a cross-sectional view of a reticle and a pellicle film conventionally positioned over the reticle during photolithography.
Figure 2:
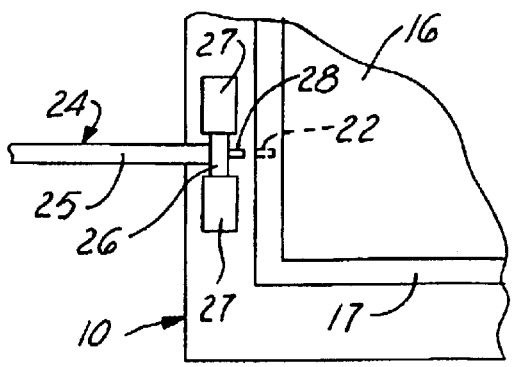
FIG. 2 is a top view, partially in section, of a pellicle frame supported over a reticle, more particularly illustrating removal of the pellicle frame from the reticle using a conventional de-pellicle tool.
Figure 2A:
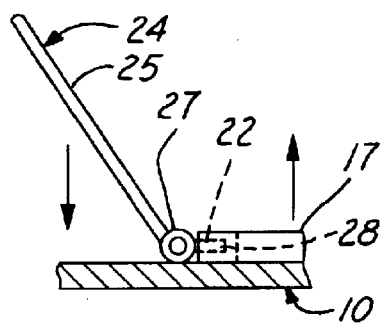
FIG. 2A illustrates engagement of the conventional de-pellicle tool with the pellicle frame for removal of the pellicle frame from the reticle.
Figure 2B:
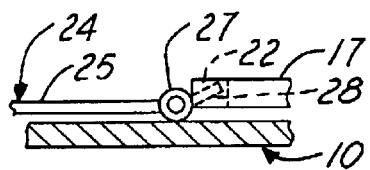
FIG. 2B illustrates lifting of the pellicle frame from the reticle using the conventional de-pellicle tool.
Figure 5:
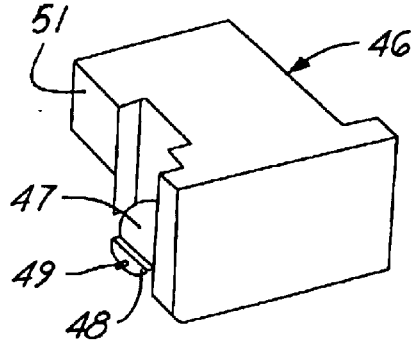
FIG. 5 is a perspective view of a lift block element of the de-pellicle tool.
Figure 4:
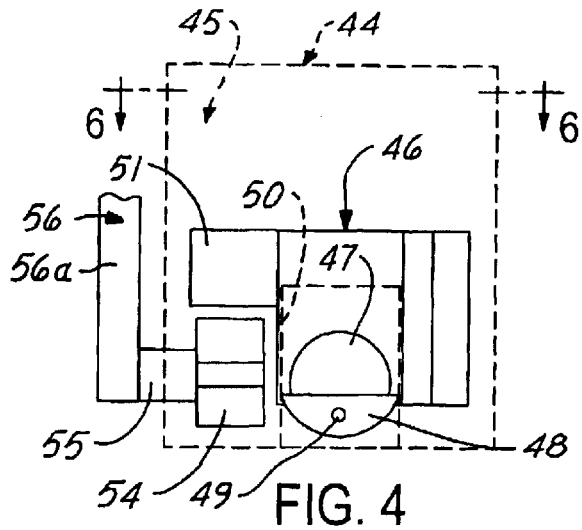
FIG. 4 is a front view of a lift block element of the de-pellicle tool of the present invention.
Figure 6:
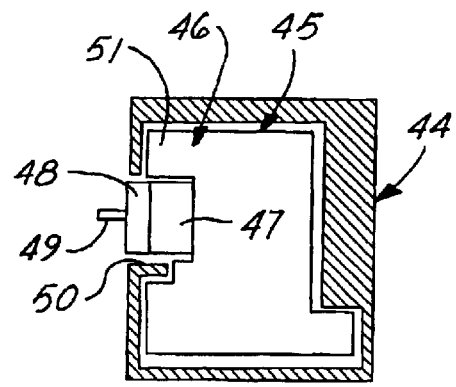
FIG. 6 is a cross-sectional view, taken along section lines 6—6 in FIG. 4.

Each pellicle lift unit 42 includes a pair of lift block housings 44 which are typically provided on the support arm 43. A support finger housing 58, having a pair of adjacent support finger slots 59, extends between the lift block housings 44 of each pellicle lift unit 42. As shown in FIGS. 4–6, a lift block 46 is vertically slidably mounted in the housing interior 45 of each lift block housing 44. A rectangular pin slot 50 is provided in each lift block housing 44, in facing relationship to the platform 37, as shown in FIG. 3. A pin mount block 47 is mounted on the front surface of the lift block 46, and a pin mount extension 48 is mounted on the front surface of the pin mount block 47. An elongated lift pin 49 extends from the pin mount extension 48. As shown in FIG. 6, the pin mount extension 48 extends through the pin slot 50 of the lift block housing 44. Accordingly, each of the pellicle lift units 42 includes a pair of the lift pins 49 which extend through the respective pin slots 50 of the pellicle lift unit 42.

Figure 9A:
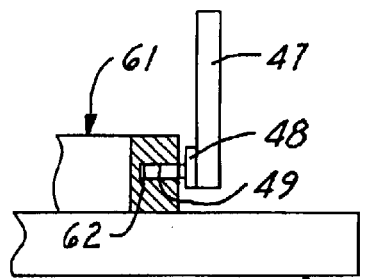
FIG. 9A is a sectional view of the pellicle frame resting on the reticle and a lift pin inserted in a pin opening provided in the pellicle frame preparatory to lifting the pellicle frame from the reticle.
Figure 9:
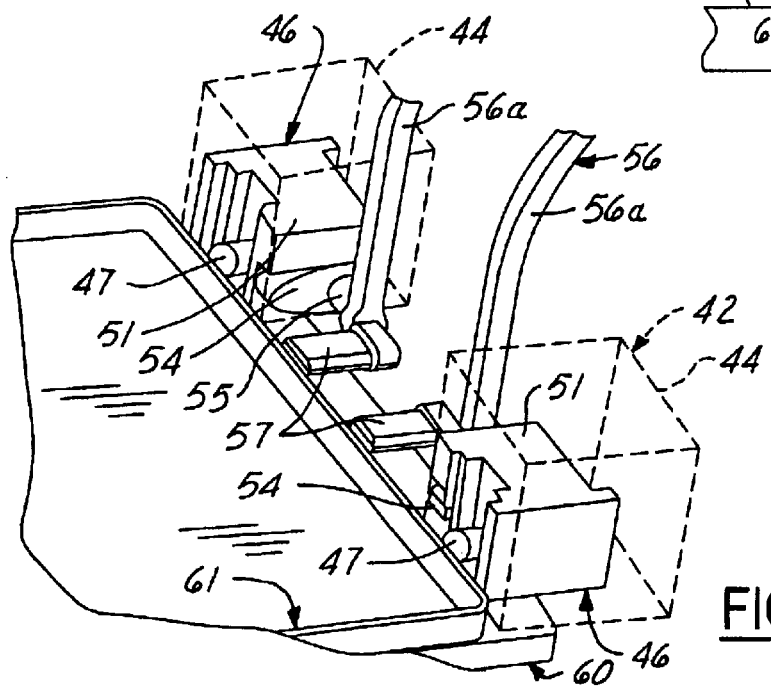
FIG. 9 is a perspective view, partially in section, of a pair of lift blocks connected by a handle on one side of the de-pellicle tool, with the lift blocks shown in the lowered position.

As further shown in FIGS. 4 and 5, a block lift flange 51 extends horizontally from each lift block 46, inside the housing interior 45. A generally elongated, triangular lift lobe 54 is disposed beneath the block lift flange 51 in the housing interior 45. As shown in FIG. 4, a lobe connector shaft 55 extends from the lift lobe 54, through a housing opening (not shown) in the lift block housing 44, and is attached to one of a pair of parallel handle members 56a of a generally U-shaped lift handle 56 that is disposed between the lift block housings 44 of the pellicle lift unit 42. A handle grip 56b spans the handle members 56a of each lift handle 56. Accordingly, as shown in FIGS. 9 and 10, the handle 56 of each pellicle lift unit 42 connects the lobe connector shaft 55 attached to the lift lobe 54 in one of the lift block housings 44 with the lobe connector shaft 55 attached to the lift lobe 54 in the other lift block housing 44 of the same pellicle lift unit 42. A pellicle support finger 57 may be mounted on each handle member 56a of the lift handle 56, for purposes hereinafter described. The pair of pellicle support fingers 57 of each pellicle lift unit 42 are contained in the support finger housing 58 thereof. As shown in FIG. 9, when the lift handle 56 is disposed in the vertical or upright position, each lift block 46 is disposed in the lowermost position in the corresponding lift block housing 44, since the elongated lift lobe 54 is disposed in the horizontal position beneath the block lift flange 51. When the lift handle 56 is pushed downwardly to the horizontal position, as shown in FIG. 10, the lobe connector shaft 55 rotates the corresponding lift lobe 54 to the upright position in the corresponding lift block housing 44. As it rotates to the upright position, the lift lobe 54 pushes upwardly against the block lift flange 51, thereby lifting the lift block 46 in the lift block housing 44 and lifting the pin mount block 47 in the corresponding pin slot 50. As further shown in FIG. 9, when the lift handle 56 is in the upright position, the pellicle support fingers 57 are retracted in the respective support finger slots 59 (FIG. 3) inside the support finger housing 58. When the lift handle 56 is pushed downwardly to the horizontal position, as shown in FIG. 10, the pellicle support fingers 57 are extended through the respective support finger slots 59 (FIG. 3) of the support finger housing 58 on the corresponding pellicle lift unit 42.

Figure 7:
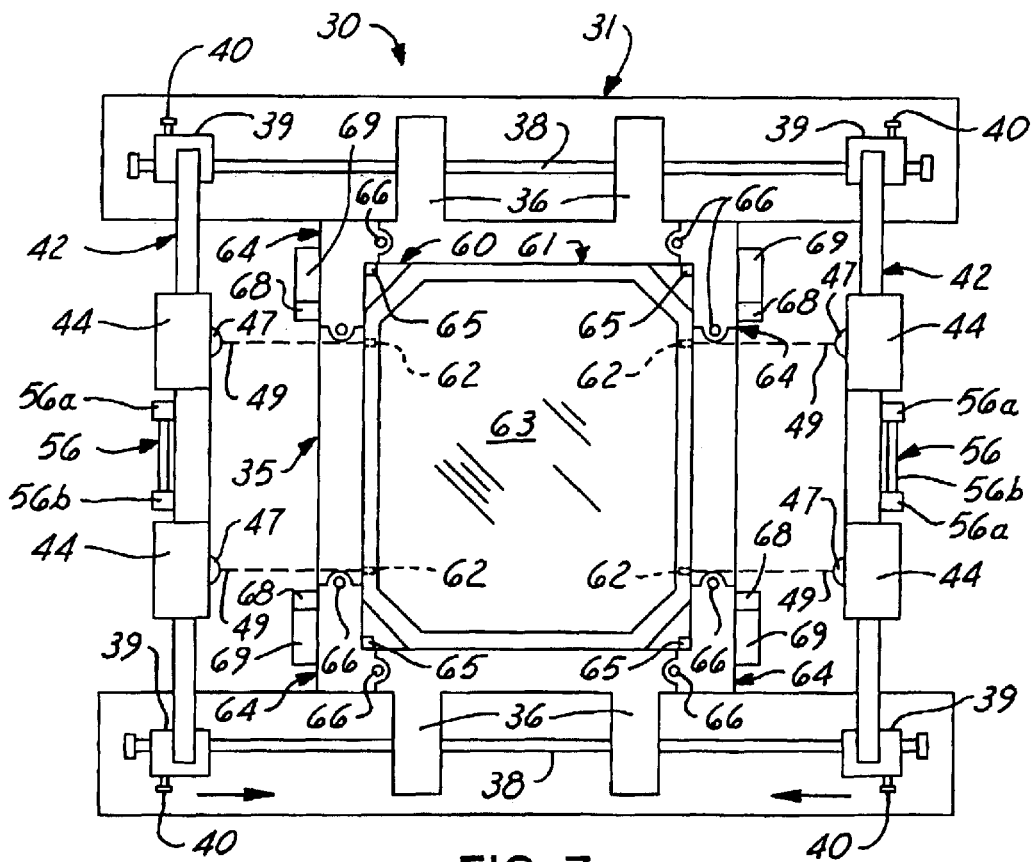
FIG. 7 is a top view of the de-pellicle tool of the present invention, preparatory to use.
Figure 8:
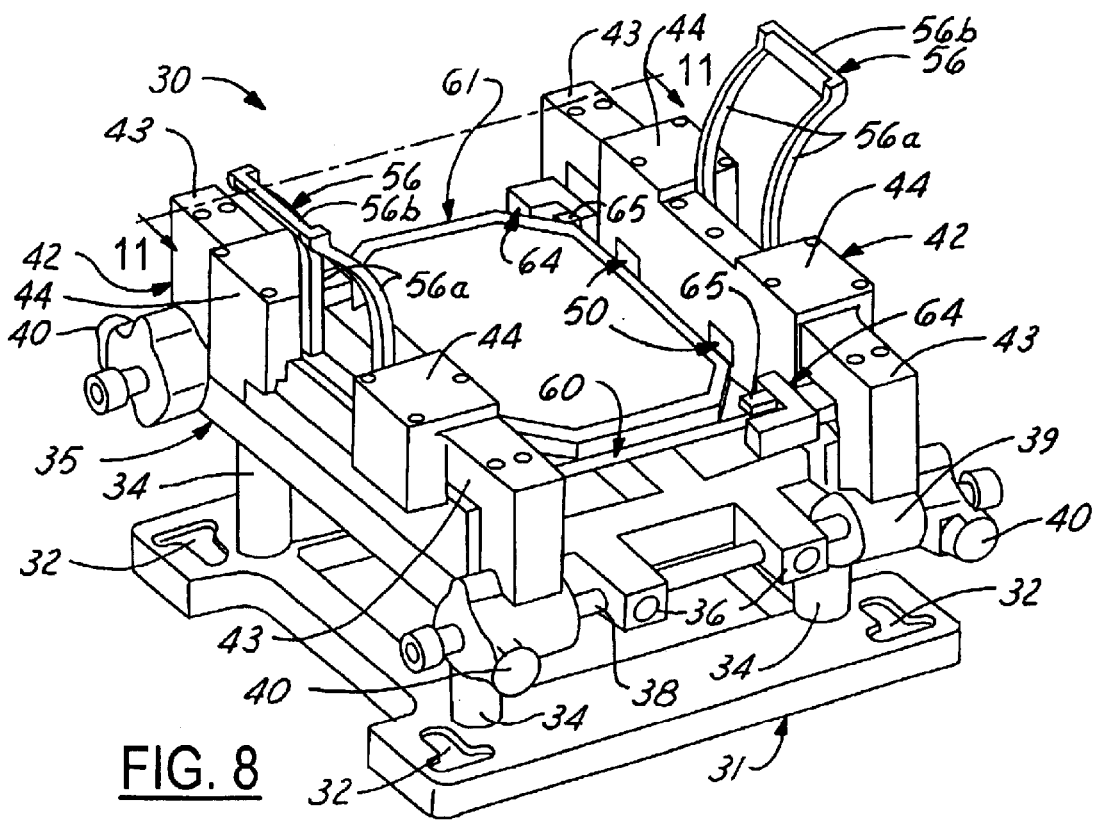
FIG. 8 is a perspective view of the de-pellicle tool of the present invention, in use thereof.

Referring next to FIGS. 7–12, in application of the de-pellicle tool 30 of the present invention, a reticle 60, having a pellicle frame 61 spanned by a pellicle film 63, is supported above the platform 37 or other elements of the support frame 35. As shown in FIGS. 7 and 11, the reticle 60 is supported above the platform 37 or support frame 35 on four reticle clamps 64, each of which is secured to the support frame 35 typically by threaded fasteners 66. As shown in FIG. 12, each reticle clamp 64 typically has a generally L-shaped cross-sectional configuration and includes a reticle support 67 on which the reticle 60 rests. Each reticle support 67 engages the backside of the reticle 60 at a corresponding corner thereof. A clamp tab 65, engaged by a clamp tab actuating lever 68 having a handle 69, may be selectively extended from a tab opening (not shown) provided in the reticle clamp 64, by actuation of the lever 68, according to the knowledge of those skilled in the art, to engage the upper surface of the reticle 60 at the corresponding corner thereof. It is understood that alternative methods known by those skilled in the art may be used to support the reticle 60 above the platform 37 or support frame 35. As further shown in FIG. 7, the parallel pellicle lift units 42, initially positioned in spaced-apart relationship to the support frame 35 on opposite sides of the de-pellicle tool 30, are typically simultaneously driven on the parallel slide shafts 38 toward the support frame 35, as indicated by the arrows in FIG. 7, typically by rotation of each slide knob 40. As shown in FIG. 9, because the lift handle 56 of each pellicle lift unit 42 is disposed in the vertical, raised position, the lift blocks 46 are likewise disposed in the lowermost position inside the respective lift block housings 44. The pin mount blocks 47, provided on the respective lift blocks 46, are disposed in the lowermost position inside the respective pin slots 50. At this position, the lift pins 49 extending from each pin mount extension 48 on each pin mount block 47 are disposed in vertical and horizontal alignment with respective pin openings 62 provided in the corresponding side of the pellicle frame 61. Furthermore, the pellicle support fingers 57 are retracted in the support finger housing 58. Accordingly, as shown in FIG. 7, sliding movement of each pellicle lift unit 42 on the slide shafts 38 toward the support frame 35 is continued until the lift pins 49 of each pellicle lift unit 42 are inserted in the pair of respective pin openings 62 provided in the corresponding side of the pellicle frame 61, as shown in FIG. 9A. Next, the lift handles 56 on the respective pellicle lift units 42 are simultaneously pushed downwardly from the vertical position of FIG. 9 to the horizontal position of FIG. 10, to facilitate rotation of each lift lobe 54 from the horizontal to the vertical, upright position in the corresponding lift block housing 44. This causes the lift lobes 54 to push upwardly against the block lift flanges 51 on the respective lift blocks 46 which, in turn, lift the respective pin mount blocks 47 attached thereto. The lift pins 49, inserted in the respective pin openings 62 in the corresponding side of the pellicle frame 61, are therefore raised and lift the pellicle frame 61 from the surface of the reticle 60, as shown in FIG. 10A. Because the lift handles 56 of the opposing pellicle lift units 42 are pushed downwardly at the same time, all four of the lift pins 49 are raised simultaneously, thereby maintaining the pellicle frame 61 in a substantially horizontal position throughout the lifting operation and separating all portions of the pellicle frame 61 from the reticle 60 at the same time. As the lift handles 56 are pushed downwardly, each corresponding pair of pellicle support fingers 57 is extended through the pair of respective support finger slots 59, beneath the lower edge of the pellicle frame 61, as shown in FIG. 10, to support the pellicle frame 61 above the reticle 60. Because no moving parts of the de-pellicle tool 30 contact the reticle 60 during removal of the pellicle frame 61 from the reticle 60, the reticle 60 is invulnerable to scratches which may otherwise tend to damage or compromise the integrity of the reticle 60. Furthermore, it will be appreciated from a consideration of FIG. 11 that, because the reticle 60 is supported above the platform 37 or support frame 35 by the reticle supports 67 of the respective reticle clamps 64, and the reticle supports 67 contact the backside of the reticle 60 only at the corners thereof, the backside of the reticle 60 is not scratched during removal of the pellicle 61 from the reticle 60. After the pellicle frame 61 is removed from the pellicle support fingers 57, the clamp tabs 65 of the respective reticle clamps 64 (FIG. 7) are removed from contact with the reticle 60, by retracting the clamp tabs 65 into the respective reticle clamps 64, as shown in FIG. 12, by actuation of the respective clamp tab actuating levers 68. Finally, the reticle 60 is removed from the reticle supports 67 of the respective reticle clamps 64.

While the preferred embodiments of the invention have been described above, it will be recognized and understood that various modifications can be made in the invention and the appended claims are intended to cover all such modifications which may fall within the spirit and scope of the invention.

What is claimed is:

1. A de-pellicle tool for removing a pellicle from a reticle, comprising:
   a frame having a reticle support surface for receiving the reticle;
   a first pellicle lift unit carried by said frame on a first side of said reticle support surface for engaging and lifting a first side of the pellicle from the reticle; and
   a second pellicle lift unit carried by said frame on a second side of said reticle support surface opposite said first side for engaging and lifting a second side of the pellicle from the reticle, whereby the pellicle is suspended above the reticle.

2. A de-pellicle tool for removing a pellicle from a reticle, comprising:
   a frame for receiving the reticle;
   a first pellicle lift unit carried by said frame for engaging and lifting a first side of the pellicle from the reticle;
   a second pellicle lift unit carried by said frame for engaging and lifting a second side of the pellicle from the reticle; and
   wherein said first pellicle lift unit comprises a first pair of lift pins for engaging the first side of the pellicle, a first lift handle operably engaging said first pair of lift pins for raising said first pair of lift pins, a second pair of lift pins for engaging the second side of the pellicle, and a second lift handle operably engaging said second pair of lift pins for raising said second pair of lift pins.

3. The de-pellicle tool of claim 1 further comprising a pair of slide shafts carried by said frame and wherein said first pellicle lift unit and said second pellicle lift unit are slidably carried by said pair of slide shafts.

4. The de-pellicle tool of claim 3 wherein said first pellicle lift unit comprises a first pair of lift pins for engaging the first side of the pellicle, a first lift handle operably engaging said first pair of lift pins for raising said first pair of lift pins, a second pair of lift pins for engaging the second side of the pellicle, and a second lift handle operably engaging said second pair of lift pins for raising said second pair of lift pins.

5. The de-pellicle tool of claim 2 further comprising a first pair of lift blocks vertically slidably carried by said first pellicle lift unit and a second pair of lift blocks vertically slidably carried by said second pellicle lift unit; a first pair of lift lobes provided on said first lift handle for raising said first pair of lift blocks, respectively, and a second pair of lift lobes provided on said second handle for raising said second pair of lift blocks, respectively; and wherein said first pair of lift pins is provided on said first pair of lift blocks, respectively, and said second pair of lift pins is provided on said second pair of lift blocks, respectively.

6. The de-pellicle tool of claim 5 further comprising a pair of slide shafts carried by said frame and wherein said first pellicle lift unit and said second pellicle lift unit are slidably carried by said pair of slide shafts.

7. The de-pellicle tool of claim 2 further comprising a first pair of pellicle support fingers engaged by said first lift handle and a second pair of pellicle support fingers engaged by said second lift handle for supporting the pellicle above the reticle.

8. The de-pellicle tool of claim 7 further comprising a pair of slide shafts carried by said frame and wherein said first pellicle lift unit and said second pellicle lift unit are slidably carried by said pair of slide shafts.

9. The de-pellicle tool of claim 7 further comprising a first pair of lift blocks vertically slidably carried by said first pellicle lift unit and a second pair of lift blocks vertically slidably carried by said second pellicle lift unit; a first pair of lift lobes provided on said first lift handle for raising said first pair of lift blocks, respectively, and a second pair of lift lobes provided on said second handle for raising said second pair of lift blocks, respectively; and wherein said first pair of lift pins is provided on said first pair of lift blocks, respectively, and said second pair of lift pins is provided on said second pair of lift blocks, respectively.

10. The de-pellicle tool of claim 9 further comprising a pair of slide shafts carried by said frame and wherein said first pellicle lift unit and said second pellicle lift unit are slidably carried by said pair of slide shafts.

11. The de-pellicle tool of claim 3 further comprising a first slide knob provided on said first pellicle lift unit and operably engaging one of said pair of slide shafts for sliding said first pellicle lift unit on said pair of slide shafts and a second slide knob provided on said second pellicle lift unit and operably engaging one of said pair of slide shafts for sliding said second pellicle lift unit on said pair of slide shafts.

12. The de-pellicle tool of claim 11 wherein said first pellicle lift unit comprises a first pair of lift pins for engaging the first side of the pellicle, a first lift handle operably engaging said first pair of lift pins for raising said first pair of lift pins, a second pair of lift pins for engaging the second side of the pellicle, and a second lift handle operably engaging said second pair of lift pins for raising said second pair of lift pins.

13. The de-pellicle tool of claim 12 further comprising a first pair of lift blocks vertically slidably carried by said first pellicle lift unit and a second pair of lift blocks vertically slidably carried by said second pellicle lift unit; a first pair of lift lobes provided on said first lift handle for raising said first pair of lift blocks, respectively, and a second pair of lift lobes provided on said second handle for raising said second pair of lift blocks, respectively; and wherein said first pair of lift pins is provided on said first pair of lift blocks, respectively, and said second pair of lift pins is provided on said second pair of lift blocks, respectively.

14. The de-pellicle tool of claim 12 further comprising a first pair of pellicle support fingers engaged by said first lift handle and a second pair of pellicle support fingers engaged by said second lift handle for supporting the pellicle above the reticle.

15. The de-pellicle tool of claim 14 further comprising a first pair of lift blocks vertically slidably carried by said first pellicle lift unit and a second pair of lift blocks vertically slidably carried by said second pellicle lift unit; a first pair of lift lobes provided on said first lift handle for raising said first pair of lift blocks, respectively, and a second pair of lift lobes provided on said second handle for raising said second pair of lift blocks, respectively; and wherein said first pair of lift pins is provided on said first pair of lift blocks, respectively, and said second pair of lift pins is provided on said second pair of lift blocks, respectively.

16. A de-pellicle tool for removing a pellicle from a reticle, comprising:
   a base;
   a frame carried by said base for receiving the reticle;
   a first pellicle lift unit carried by said frame for engaging and lifting a first side of the pellicle from the reticle;

at least one pellicle support finger extendible from said first pellicle lift unit for supporting the pellicle above the reticle;

a second pellicle lift unit carried by said frame for engaging and lifting a second side of the pellicle from the reticle; and at least one pellicle support finger extendible from said second pellicle lift unit for supporting the pellicle above the reticle.

17. A de-pellicle tool for removing a pellicle from a reticle, comprising:

a base;

a frame carried by said base for receiving the reticle;

a first pellicle lift unit carried by said frame for engaging and lifting a first side of the pellicle from the reticle;

a second pellicle lift unit carried by said frame for engaging and lifting a second side of the pellicle from the reticle; and wherein said first pellicle lift unit comprises a first pair of lift pins for engaging the first side of the pellicle, a first lift handle operably engaging said first pair of lift pins for raising said first pair of lift pins, a second pair of lift pins for engaging the second side of the pellicle, and a second lift handle operably engaging said second pair of lift pins for raising said second pair of lift pins.

18. The de-pellicle tool of claim 17 further comprising a first pair of lift blocks vertically slidably carried by said first pellicle lift unit and a second pair of lift blocks vertically slidably carried by said second pellicle lift unit; a first pair of lift lobes provided on said first lift handle for raising said first pair of lift blocks, respectively, and a second pair of lift lobes provided on said second handle for raising said second pair of lift blocks, respectively; and wherein said first pair of lift pins is provided on said first pair of lift blocks, respectively, and said second pair of lift pins is provided on said second pair of lift blocks, respectively.

19. A de-pellicle tool for removing a pellicle from a reticle, comprising:

a frame;

a reticle support surface carried by said frame for receiving the reticle;

a first pellicle lift unit carried by said frame for engaging and lifting a first side of the pellicle from the reticle support surface;

a pair of pellicle support fingers extendible from said first pellicle lift unit for supporting the pellicle above the reticle;

a second pellicle lift unit carried by said frame for engaging and lifting a second side of the pellicle from the reticle support surface; and a pair of pellicle support fingers extendible from said second pellicle lift unit for supporting the pellicle above the reticle.

20. A de-pellicle tool for removing a pellicle from a reticle, comprising:

a frame;

a reticle support surface carried by said frame for receiving the reticle;

a first pellicle lift unit carried by said frame for engaging and lifting a first side of the pellicle from the reticle support surface;

a second pellicle lift unit carried by said frame for engaging and lifting a second side of the pellicle from the reticle support surface; and wherein said first pellicle lift unit comprises a first pair of lift pins for engaging the first side of the pellicle, a first lift handle operably engaging said first pair of lift pins for raising said first pair of lift pins, a second pair of lift pins for engaging the second side of the pellicle, and a second lift handle operably engaging said second pair of lift pins for raising said second pair of lift pins.

* * * * *